US007007933B2

(12) United States Patent
Lee et al.

(10) Patent No.: US 7,007,933 B2
(45) Date of Patent: Mar. 7, 2006

(54) METHOD AND APPARATUS FOR SUPPLYING A SOURCE GAS

(75) Inventors: Jai-Dong Lee, Gyeonggi-do (KR); Ki-Hyun Hwang, Gyeonggi-do (KR); Chang-Hyun Ko, Seoul (KR)

(73) Assignee: Samsung Electronics Co., Ltd., (KR)

( * ) Notice: Subject to any disclaimer, the term of this patent is extended or adjusted under 35 U.S.C. 154(b) by 76 days.

(21) Appl. No.: 10/431,981

(22) Filed: May 8, 2003

(65) Prior Publication Data
US 2004/0041286 A1 Mar. 4, 2004

(30) Foreign Application Priority Data
Aug. 30, 2002 (KR) ...................... 10-2002-0052021

(51) Int. Cl.
*B01F 3/04* (2006.01)
(52) U.S. Cl. ................... 261/121.1; 261/128; 261/142; 261/DIG. 65; 438/680
(58) Field of Classification Search ............. 261/121.1, 261/122.1, 124, 142, DIG. 65, 128; 438/680
See application file for complete search history.

(56) References Cited

U.S. PATENT DOCUMENTS

| 3,650,151 | A | * | 3/1972 | Drexel ..................... 73/861.04 |
| 3,826,560 | A | * | 7/1974 | Schultz ....................... 385/124 |
| 4,105,725 | A | * | 8/1978 | Ross ........................ 261/122.1 |
| 4,220,460 | A | * | 9/1980 | Partus ......................... 65/530 |
| 4,276,243 | A | * | 6/1981 | Partus ......................... 261/128 |
| 4,393,013 | A | * | 7/1983 | McMenamin ............... 261/64.3 |
| 4,436,674 | A | * | 3/1984 | McMenamin ............... 261/64.3 |
| 4,582,480 | A | * | 4/1986 | Lynch et al. ................... 432/1 |
| 4,783,343 | A | * | 11/1988 | Sato .............................. 427/8 |
| 5,589,110 | A | * | 12/1996 | Motoda et al. ............... 261/61 |
| 5,700,401 | A | * | 12/1997 | Weinberg et al. ............. 261/27 |
| 5,730,804 | A | | 3/1998 | Gomi et al. ................. 118/726 |
| 5,972,117 | A | * | 10/1999 | Schmitt ...................... 118/726 |
| 6,155,540 | A | | 12/2000 | Takamatsu et al. ........ 261/78.2 |
| 6,179,277 | B1 | * | 1/2001 | Huston et al. .............. 261/128 |
| 6,281,125 | B1 | | 8/2001 | Vaartstra et al. ............ 438/681 |
| 6,874,770 | B1 | * | 4/2005 | Torkaman ................... 261/130 |
| 6,893,964 | B1 | * | 5/2005 | Oshima ...................... 438/680 |

FOREIGN PATENT DOCUMENTS

JP        1997-186107        7/1997

OTHER PUBLICATIONS

Notice of Office Action, Korean Application No. 10-2002-0052021, Jul. 30, 2004.

* cited by examiner

*Primary Examiner*—Richard L. Chiesa
(74) *Attorney, Agent, or Firm*—Myers Bigel Sibley & Sajovec, P.A.

(57) ABSTRACT

A method for supplying a source gas to a processing chamber for forming a film on a substrate in the processing chamber includes: heating a carrier gas; bubbling the heated carrier gas in a liquid source disposed in a container to form a vapor source; and supplying a source gas including the vapor source and the heated carrier gas into the processing chamber for forming the film.

20 Claims, 5 Drawing Sheets

METHOD AND APPARATUS FOR SUPPLYING A SOURCE GAS

RELATED APPLICATION

The present application claims priority from Korean Patent Application No. 2002-52021 filed Aug. 30, 2002, the disclosure of which is hereby incorporated herein by reference in its entirety.

FIELD OF THE INVENTION

The present invention relates to methods and apparatus for supplying a source gas, and more particularly to a method for supplying a source gas by changing a liquid source for forming a film on a substrate into the source gas, and an apparatus for performing the same.

BACKGROUND OF THE INVENTION

Generally, semiconductor devices are manufactured by repeatedly performing a series of unit processes including a deposition process, a photolithography process, an etching process, a chemical-mechanical polishing process, a cleaning process, a drying process and so on. In these unit processes, the deposition process is executed to form a film on a semiconductor substrate. The deposition process has become of particular concern in semiconductor manufacturing technology as the patterns formed on semiconductor substrates have become minute, and the aspect ratios of the patterns have increased.

Processes for forming the film on the semiconductor substrate include a chemical vapor deposition (CVD) process, a low pressure chemical vapor deposition (LPCVD) process, a plasma enhanced chemical vapor deposition (PECVD) process, and a metal organic chemical vapor deposition (MOCVD) process. Recently, an atomic layer deposition (ALD) process, a cyclic chemical vapor deposition (CCVD) process, a digital chemical vapor deposition (DCVD) process, and an advanced chemical vapor deposition (ACVD) process have been used.

In the process for forming the film, required elements are supplied to the semiconductor as raw materials for forming the film in a gas phase. Thus, a source gas is prepared including reactants comprising metal organic precursors and metal halides in addition to the required elements, then the source gas is provided to the substrate. To minimize impurities in the desired film formed on the substrate using the CVD process, organic ligands or halides combined with metal elements among the reactants provided to the substrate are decomposed so that the organic ligands or halides are removed from the substrate. On the other hand, in the ALD process, the organic ligands or halides are removed from the substrate by means of chemical exchange reactions. According to the ALD process, the required source gases are not mixed in a processing chamber. Rather, the required source gases are successively provided in the processing chamber using a pulse method. For example, when the film is formed using a first source gas and a second source gas, the first source gas is primarily provided into the processing chamber so that the first source gas is chemically absorbed on the substrate. Then, the second source gas is provided into the processing chamber such that the second source gas is chemically bonded onto the substrate.

In general, the source gas is evaporated from a liquid source, then is provided into a processing chamber by means of a carrier gas. The main parameters of the process for forming the film include deposition time, deposition pressure, the supply time of the source gas, the supply time of a purge gas, and the impurity concentration of the source gas. The impurity concentration of the film, the step coverage of the film and the uniformity of the film have become increasingly important in determining the performance of a semiconductor device as the degree of integration of semiconductor devices has increased.

U.S. Pat. No. 6,155,540 to Takamatsu et al. discloses an apparatus for supplying a source gas obtained by evaporating a liquid source. In the apparatus for supplying the source gas, after the liquid source for the chemical vapor deposition is introduced into a vaporizer by the controlled flow rate, the liquid source is sprayed by an ultrasonic atomizing device installed at the inside or the outside of the vaporizer. The liquid source is then heated and evaporated by a carrier gas.

Also, a method is provided for supplying a source gas by bubbling a carrier gas in a liquid source to form the source gas.

FIG. 1 is a schematic cross-sectional view illustrating a conventional apparatus 100 for supplying a source gas.

Referring to FIG. 1, a liquid source 10 is disposed in a sealed container 102. A heater 104 is disposed beneath the container 102 for heating the liquid source 10. A carrier gas supplying line 110 is installed such that it passes through the upper portion of the container 102, and the end portion of the carrier gas supplying line 110 is immersed in the liquid source 10 in the container 102.

The liquid source 10 is evaporated by the bubbling of carrier gas provided from the carrier gas supplying line 110 and heating of the heater 104. The vapor source prepared in the container 102 is introduced into a processing chamber 140 together with the carrier gas through a source gas supplying line 112.

Additionally, a purge gas supplying line 114 is connected to the processing chamber 140 for supplying a purge gas to purge the processing chamber.

A chuck 142 for supporting a semiconductor substrate W is installed in the processing chamber 140. A heater (not shown) is provided in the processing chamber 140 to control the temperature of the semiconductor substrate W. A vacuum pump (not shown) and a pressure control valve (not shown) are connected to the processing chamber 140 for adjusting the inner pressure of the processing chamber 140.

A flow rate control valve 120 is installed in the carrier gas supplying line 110 to control the supply flow rate of the carrier gas provided into the container 102. The source gas supplying line 112 and the purge gas supplying line 114 are connected to the processing chamber 140 through an integrated gas supply unit (IGS) 130 for controlling the supply flow rates and supply times of the purge gas and a source gas, the source gas including the vapor source and the carrier gas.

The source gas is supplied into the processing chamber 140, and is then reacted with the surface of the semiconductor substrate W so that a film is formed on the semiconductor substrate W. Un-reacted gas and reaction by-products are exhausted from the processing chamber 140 by the supply of the purge gas and operation of the vacuum pump.

When an atomic layer deposition process is performed for forming the film on the semiconductor substrate W using the apparatus 100 to supply the source gas, the carrier gas provided into the container 102 has a temperature of about room temperature (approximately 23° C.), and the liquid source 10 in the container 102 is heated to a high temperature by the heater 104. For example, when titanium alkoxide (Ti(OC$_3$H$_7$)$_4$) is used as the liquid source 10 to form a titanium oxide (TiO$_2$) film on the semiconductor substrate W, the liquid source 10 is heated to a temperature of above about 80° C. However, the deposition rate of the titanium oxide film is reduced because the temperature of the carrier gas is lower than that of the liquid source 10. Thus, the supply flow rate and the supply time of the carrier gas typically must be increased in order to deposit a film having a required thickness.

FIGS. 2 and 3 are graphs showing the deposition rate of a titanium oxide film formed by an atomic layer deposition process using a source gas provided from an apparatus for supplying source gas as shown in FIG. 1.

Referring to FIGS. 2 and 3, the deposition rate of the titanium oxide film increases in accordance with the increase in the supply flow rate and the supply time of the carrier gas. The source gas used for depositing the titanium oxide film includes the titanium alkoxide and ozone (O$_3$), and the carrier and purge gases include argon (Ar) gases. In FIG. 2, the supply time of the carrier gas and purge time are approximately 2 seconds, respectively. In FIG. 3, the supply flow rate of carrier gas is approximately 500 sccm.

When the temperature of the liquid source is excessively increased to increase the deposition rate of the titanium oxide film, the liquid source may be thermally decomposed, thereby deteriorating certain characteristics of the liquid source. Thus, increasing the temperature of the liquid source to improve the evaporation efficiency of the liquid source may be disadvantageous. In addition, when the supply time of the source gas is extended to form a film having the desired thickness, the supply time of the purge gas typically must be prolonged, also. Hence, the throughput of the deposition process may be reduced in accordance with the supply time extensions of the source and purge gases.

Also, the source gas provided through the source gas supplying line and IGS unit has a temperature lower than that of the liquid source due to the carrier gas while the purge gas provided into the processing chamber through the purge gas supplying line of the IGS unit has a temperature substantially identical to the initial temperature of the carrier gas. Thus, the temperature of the IGS unit is lower than that of the source gas due to the purge gas. As a result, organic metal materials included in the source gas passing through the source gas supplying line and the IGS unit may be extracted as solid phases as a result of the temperature lowering of the IGS unit. The extracted organic metal materials may move into the processing chamber and serve as impurities in the film formed on the semiconductor substrate.

SUMMARY OF THE INVENTION

According to embodiments of the present invention, methods and apparatus for supplying a source gas may be provided that improve the evaporation efficiency of a liquid source and prevent or reduce the generation of impurities.

According to method embodiments of the present invention, a method for supplying a source gas to a processing chamber for forming a film on a substrate in the processing chamber includes: heating a carrier gas; bubbling the heated carrier gas in a liquid source disposed in a container to form a vapor source; and supplying a source gas including the vapor source and the heated carrier gas into the processing chamber for forming the film.

According to further method embodiments of the present invention, a method for supplying a source gas and purge gas to a processing chamber for forming a film on a substrate in the processing chamber includes: heating a carrier gas; heating a purge gas; heating a liquid source disposed in a container; bubbling the heated carrier gas in the heated liquid source to form a vapor source; supplying a source gas including the vapor source and the heated carrier gas into the processing chamber; and supplying the heated purge gas into the processing chamber to purge the processing chamber.

According to embodiments of the present invention, an apparatus for supplying a source gas and a purge gas to a processing chamber for forming a film on a substrate in the processing chamber, the source gas including a carrier gas and a vapor source, is provided. The apparatus includes a hot gas generator to heat the carrier gas and to heat the purge gas. The apparatus further includes a container to hold a liquid source. A carrier gas supplying line is configured to bubble the heated carrier gas in the liquid source to form the vapor source. A source gas supplying line is provided to supply the source gas including the vapor source and the heated carrier gas into the processing chamber. A purge gas supplying line is provided to supply the heated purge gas into the processing chamber to purge the processing chamber.

According to further embodiments of the present invention, an apparatus for supplying a first source gas and a second source gas to a processing chamber for forming first and second films, respectively, on a substrate in the processing chamber, the first source gas including a first carrier gas and a first vapor source, the second source gas including a second carrier gas and a second vapor source, the first vapor source having a first vapor pressure at a prescribed temperature and the second vapor source having a second vapor pressure at room temperature, is provided. The apparatus includes a hot gas generator operative to selectively heat the first carrier gas relative to the second carrier gas. A first container is provided to hold the first liquid source, and a second container is provided to hold the second liquid source. A first carrier gas supplying tube is configured to bubble the first carrier gas selectively heated by the hot gas generator in the first liquid source to form the first vapor source. A second carrier gas supplying tube is configured to bubble the second carrier gas in the second liquid source to form the second vapor source. A first source gas supplying tube is provided to supply the first source gas including the first vapor source and the heated first carrier gas from the first container into the processing chamber. A second source gas supplying tube is provided to supply the second source gas including the second vapor source and the second carrier gas from the second container into the processing chamber.

DETAILED DESCRIPTION OF THE EMBODIMENTS OF THE PRESENT INVENTION

Figure 1:
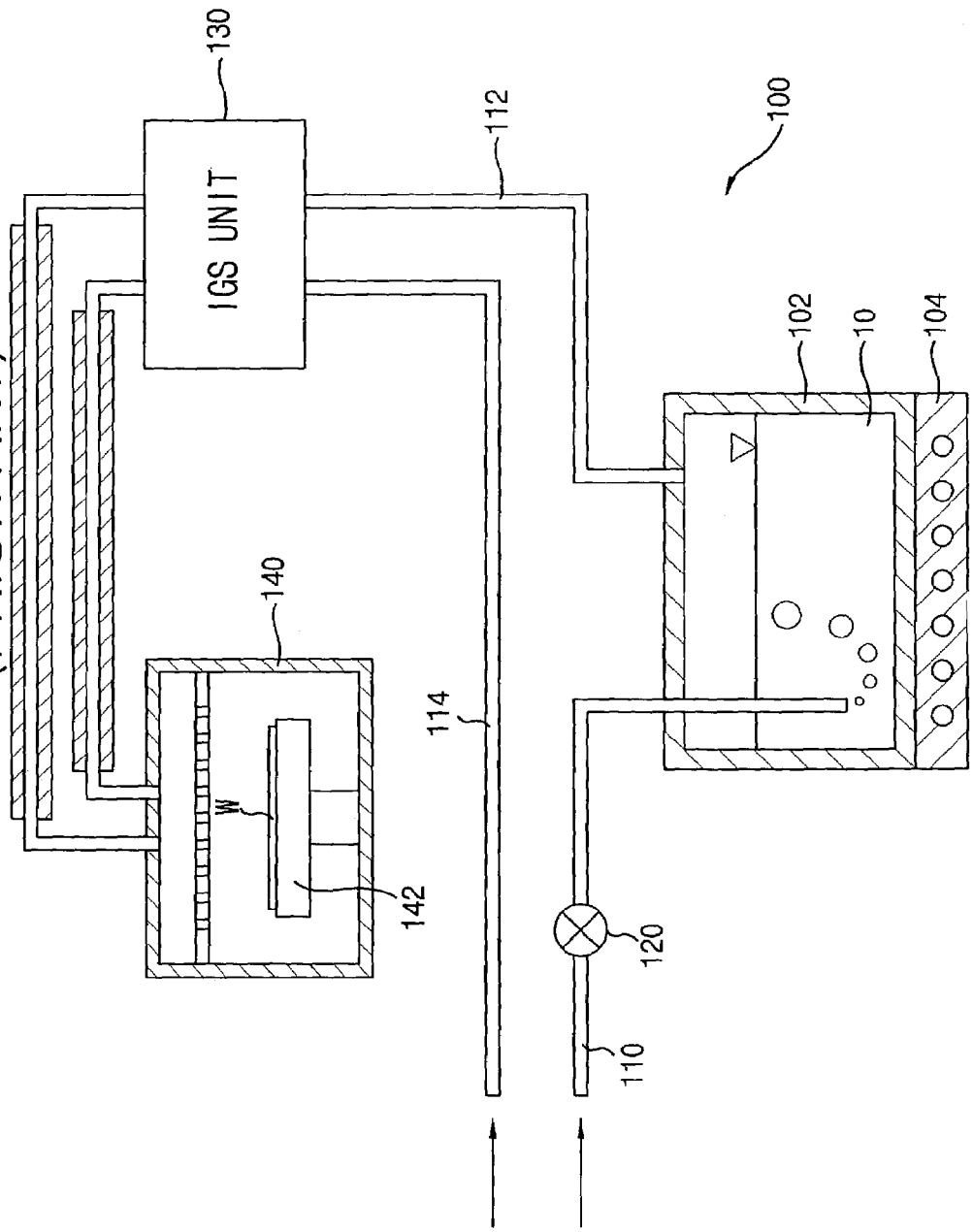
FIG. 1 is a schematic cross-sectional view illustrating a conventional apparatus for supplying a source gas.
Figure 2:
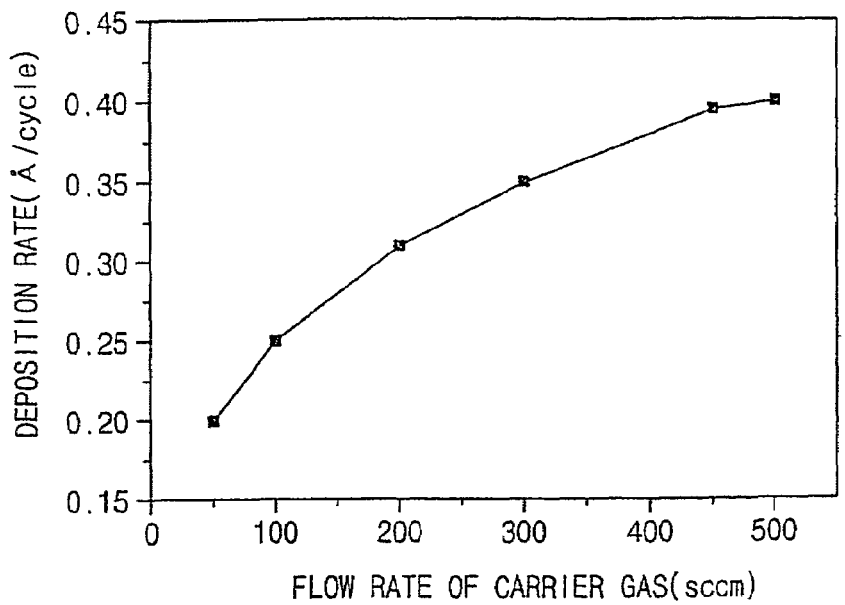
FIGS. 2 and 3 are graphs showing a deposition rate of a titanium oxide film as a function of gas flow rate, the film being formed using a source gas provided from the apparatus as shown in FIG. 1.
Figure 3:
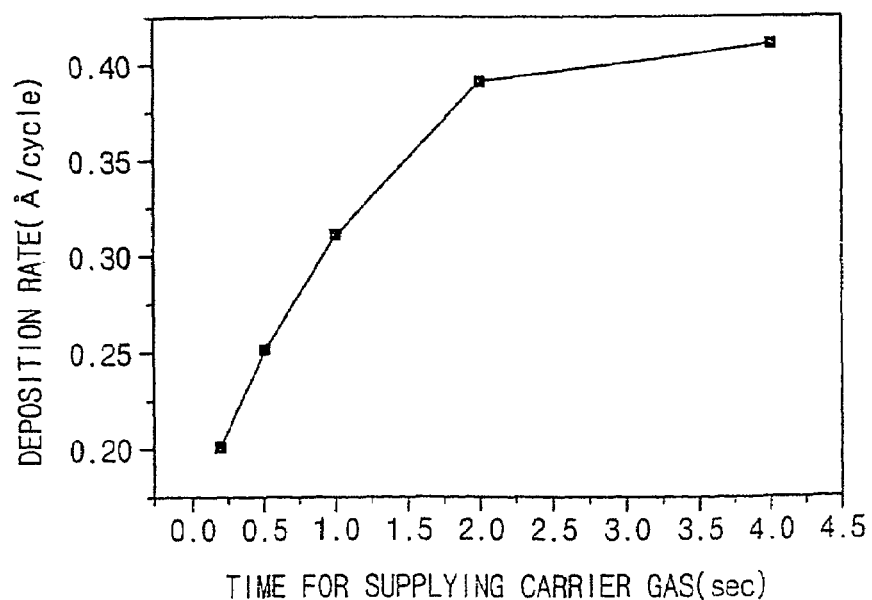

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

In accordance with embodiments of the present invention, methods and apparatus are provided for supplying a source gas to form a film on a substrate. A liquid source in a container is evaporated by bubbling a heated carrier gas through the liquid source to form a vapor source. The heated carrier gas is mixed with the vapor source evaporated from the liquid source to form the source gas, and the temperature of the source gas is thereby increased by the heated carrier gas. The vapor pressure of the vapor source increases according to the temperature increase of the source gas, thereby improving the evaporation efficiency of the liquid source. Also, extraction of impurities from the source gas during the supply of the source gas may be inhibited or prevented so that the deposition rate of the film on the substrate can be enhanced, and impurities in the film are likewise inhibited.

Figure 4:
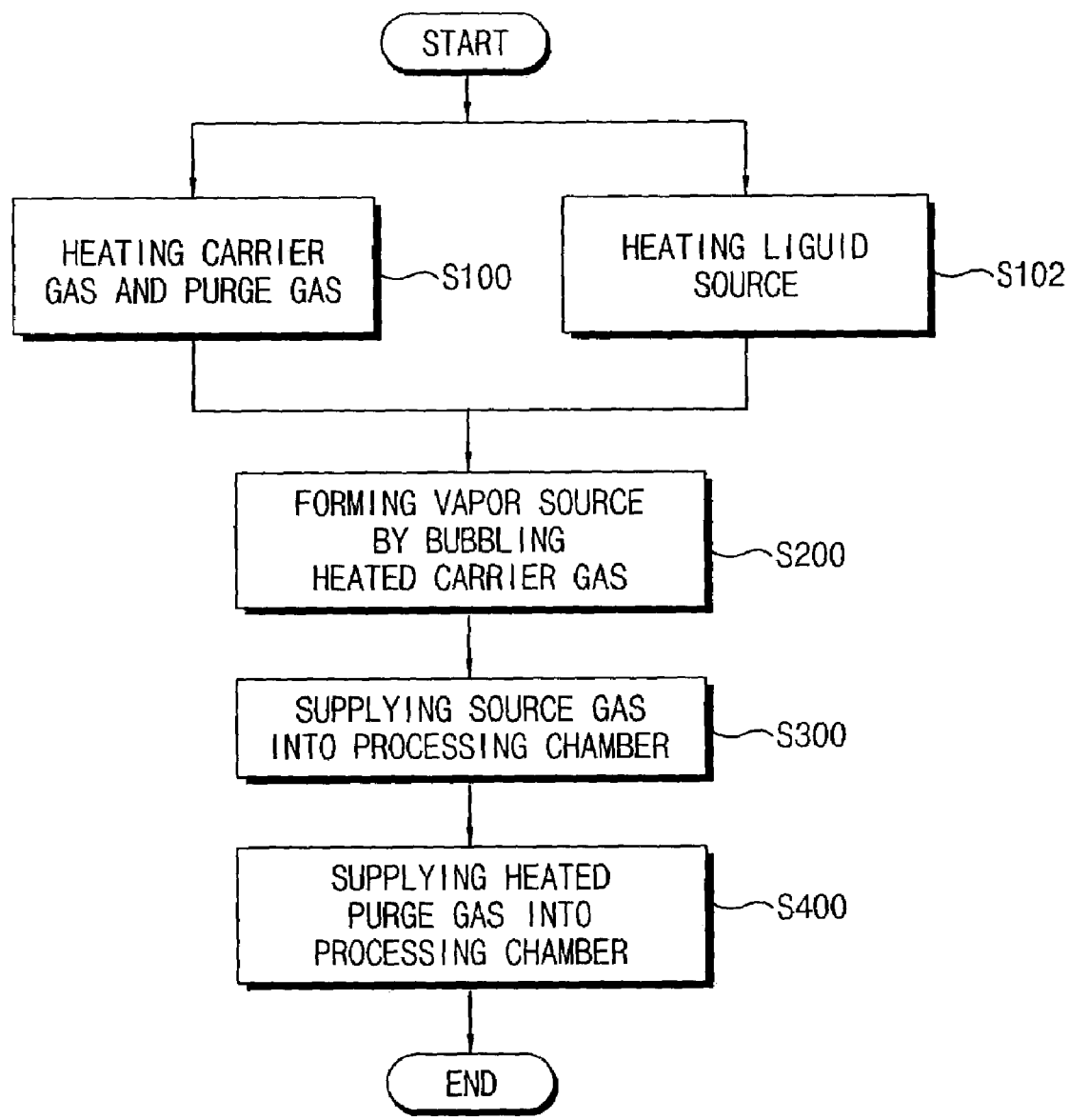
FIG. 4 is a flow chart illustrating a method for supplying a source gas according to embodiments of the present invention.
Figure 5:
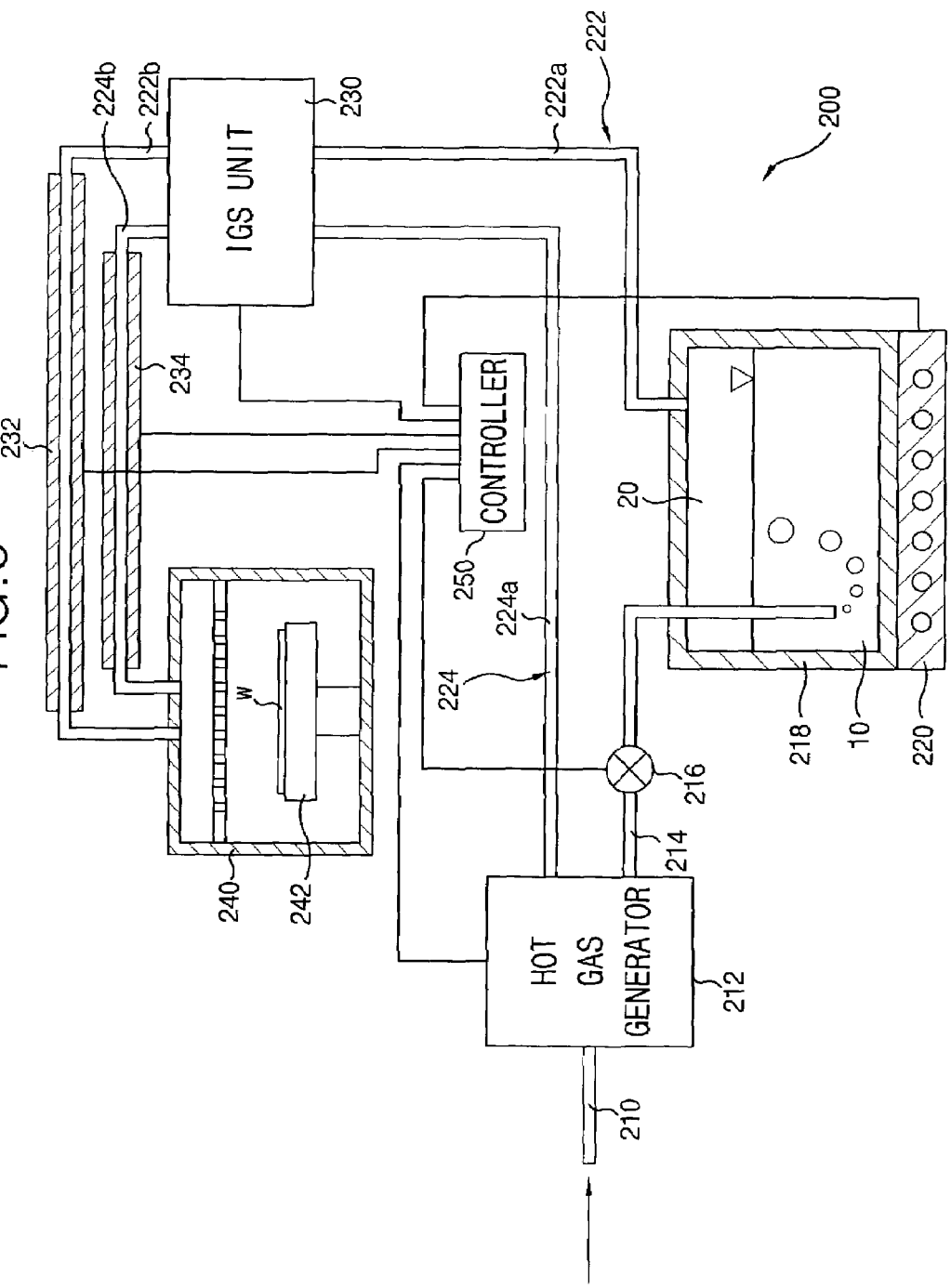
FIG. 5 is a schematic cross-sectional view illustrating an apparatus according to embodiments of the present invention for performing the method for supplying the source gas as shown in FIG. 4.

FIG. 4 is a flow chart illustrating a method for supplying a source gas according to embodiments of the present invention, and FIG. 5 is a schematic cross-sectional view illustrating an apparatus for performing the method for supplying the source gas as shown in FIG. 4, for example.

Referring to FIG. 4, a carrier gas and a purge gas are heated (step S100). The carrier gas and the purge gas preferably include inert gases such as nitrogen ($N_2$) gas or argon (Ar) gas, respectively. However, the carrier gas can be the same as the purge gas. That is, when a heated inert gas evaporates a liquid source to transfer the liquid source into a processing chamber, the heated inert gas is the carrier gas. Alternatively, when the heated inert gas purges the processing chamber, the heated inert gas becomes the purge gas.

The liquid source is disposed in a container and is heated to predetermined temperature (step S102). The step S102 may be performed before the step S100, or the steps of S100 and S102 may be simultaneously performed. The heated carrier gas preferably has the same temperature as the purge gas, and the temperature of the liquid source can be varied in accordance with the type of the liquid source. The heated carrier gas and the purge gases preferably have temperatures no less than that of the heated liquid source.

Thereafter, the heated carrier gas is bubbled in the liquid source to form a vapor source (step S200).

The heated carrier gas is mixed with the vapor source to form a source gas, and the source gas is then supplied into the processing chamber so that a film is formed on a semiconductor substrate (step S300). The temperature of the source gas is increased by the heated carrier gas. Thus, the vapor pressure of the vapor source is increased, and the evaporation efficiency of the liquid source is also increased. The concentration of the source gas may be increased in accordance with the augmentation of the evaporation efficiency of the liquid source, thereby improving the deposition rate of the film on the semiconductor substrate. The vapor pressure of the vapor source can be selected and varied depending on the thickness, kind and characteristics of the film deposited on the semiconductor substrate.

Subsequently, the heated purge gas is supplied into the processing chamber so that the processing chamber is purged using the heated purge gas. The remaining un-reacted gas and reaction by-products in the processing chamber are exhausted by the supply of the heated purge gas and the operation of a vacuum pump.

The film formed on the semiconductor substrate may include an insulation film, a dielectric film, or a metal film, and the liquid source may include metal halides and/or metal alkoxides. Additionally, the liquid source can include organic metal precursors having various ligand bonds.

Examples of the metal alkoxides include alkoxides of alkaline earth metals (Group II metals) such as magnesium (Mg), calcium (Ca) or strontium (Sr), alkoxides of trivalent elements or metals (Group III or XIII metals) such as boron (B), aluminum (Al), or lanthanum (La), alkoxides of quardivalent metals (Group IV or XIV metals) such as titanium (Ti), zirconium (Zr), hafnium (Hf), silicon (Si), germanium (Ge), tin (Sn), or lead (Pb), or alkoxides of pentavalent metals or elements (Group V and XV metals or elements) such as vanadium (V), niobium (Nb), tantalum (Ta), phosphorus (P), arsenic (As), or antimony (Sb).

Examples of magnesium alkoxide include $Mg[OC_2H_4OCH_3]_2$. Examples of the calcium alkoxide include $Ca[OC_2H_4OCH_3]_2$. Examples of the strontium alkoxide include $Sr[OC_2H_4OCH_3]_2$.

Examples of the boron alkoxide include $B[OCH_3]_3$, $B[OC_2H_5]_3$, $B[OC_3H_7]_3$, or $B[OC_4H_9]_3$. Examples of aluminum alkoxide include $Al[OC_4H_8OCH_3]_3$, $Al[OCH_3]_3$, $Al[OC_2H_5]_3$, $Al[OC_3H_7]_3$, or $Al[OC_4H_9]_3$. Examples of lanthanum alkoxide include $La[OC_2H_4OCH_3]_3$, or $La[OC_3H_7CH_2OC_3H_7]_3$.

Examples of titanium alkoxide include $Ti[OCH_3]_4$, $Ti[OC_2H_5]_4$, $Ti[OC_3H_7]_4$, $Ti[OC_4H_9]_4$, or $Ti[OC_2H_5]_2[OC_2H_4N(CH_3)_2]_2$. Examples of zirconium alkoxide include $Zr[OC_3H_7]_4$, $Zr[OC_4H_9]_4$, or $Zr[OC_4H_8OCH_3]_4$. Examples of hafnium alkoxide include $Hf[OC_4H_9]_4$, $Hf[OC_4H_8OCH_3]_4$, $Hf[OC_4H_9]_2[OC_2H_4N(CH_3)_2]_2$, $Hf[OC_4H_9]_2[OC_4H_8OCH_3]_2$, $Hf[OSi(C_2H_5)_3]_4$, $Hf[OC_2H_5]_4$, $Hf[OC_3H_7]_4$, $Hf[OC_4H_9]_4$, or $HF[OC_5H_{11}]_4$. Examples of silicon alkoxide include $Si[OCH_3]_4$, $Si[OC_2H_5]_4$, $Si[OC_3H_7]_4$, $Si[OC_4H_9]_4$, $HSi[OCH_3]_3$, $HSi[OC_2H_5]_3$, $Si[OCH_3]_3F$, $Si[OC_2H_5]_3F$, $Si[OC_3H_7]_3F$, or $Si[OC_4H_9]_3F$. Examples of germanium alkoxide include $Ge[OCH_3]_4$, $Ge[OC_2H_5]_4$, $Ge[OC_3H_7]_4$, or $Ge[OC_4H_9]_4$. Examples of tin alkoxide include $Sn[OC_4H_9]_4$, or $Sn[OC_3H_7]_3[C_4H_9]$. Examples of lead alkoxide include $Pb[OC_4H_9]_4$, or $Pb_4O[OC_4H_9]_6$.

Examples of vanadium alkoxide include $VO[OC_2H_5]_3$, or $VO[OC_3H_7]_3$. Examples of niobium alkoxide include $Nb[OCH_3]_5$, $Nb[OC_2H_5]_5$, $Nb[OC_3H_7]_5$, or $Nb[OC_4H_9]_5$. Examples of tantalum alkoxide include $Ta[OCH_3]_5$, $Ta[OC_2H_5]_5$, $Ta[OC_3H_7]_5$, $Ta[OC_4H_9]_5$, $Ta[OC_2H_5]_5[OC_2H_4N(CH_3)_2]_2$, or $Ta[OC_2H_5]_4[CH_3COCHCOCH_3]$. Examples of phosphorus alkoxide include $P[OCH_3]_3$, $P[OC_2H_5]_3$, $P[OC_3H_7]_3$, $P[OC_4H_9]_3$, $PO[OCH_3]_3$, PO[OC$_2$H$_5$]$_3$, PO[OC$_3$H$_7$]$_3$, or PO[OC$_4$H$_9$]$_3$. Examples of arsenic alkoxide include As[OCH$_3$]$_3$, As[OC$_2$H$_5$]$_3$, As[OC$_3$H$_7$]$_3$, or As[OC$_4$H$_9$]$_3$. Examples of antimony alkoxide include Sb[OC$_2$H$_5$]$_3$, Sb[OC$_3$H$_7$]$_3$, or Sb[OC$_4$H$_9$]$_3$.

Referring to the apparatus 200 as shown in FIG. 5, a supply gas supplying line 210 is connected to a hot gas generator 212 for supplying the supply gas (which is preferably an inert gas) used as the carrier gas and the purge gas. The supply gas supplied through the supplying line 210 may be directed to both a carrier gas supplying line 214 and a purge gas supplying line 224.

A sealed container 218 receives and holds the liquid source 10 for forming the film on the semiconductor substrate W. The carrier gas supplying line 214 connects the hot gas generator 212 and the container 218. The carrier gas supplying line 214 passes through the upper portion of the container 218. The end portion of the carrier gas supplying line 214 is immersed in the liquid source 10 in the container 218. A flow rate control valve 216 is installed in the carrier gas supplying line 214 for controlling the supply flow rate of the carrier gas. A first heater 220 is installed beneath the bottom face of the container 218 to heat the liquid source 10 disposed in the container 218.

A source gas supplying line 222 for supplying the source gas 20 connects the upper portion of the container 218 and the processing chamber 240 through an IGS unit 230. The purge gas supplying line 224 is connected to the processing chamber 240 through the IGS unit 230. The source gas supplying line 222 includes a first source gas supplying tube 222a and a second source gas supplying tube 222b. The first source gas supplying tube 222a connects the container 218 and the IGS unit 230. The second source gas supplying tube 222b connects the IGS unit 230 and the processing chamber 240. The purge gas supplying line 224 has a first purge gas supplying tube 224a and a second purge gas supplying tube 224b. The first purge gas supplying tube 224a connects the hot gas generator 212 and the IGS unit 230. The second purge gas supplying tube 224b connects the IGS unit 230 and the processing chamber 240. The IGS unit 230 controls the supply flow rates and supply times of the source gas and the purge gas.

A second heater 232 and a third heater 234 are installed around the second source gas and the second purge gas supplying tubes 222b and 224b, respectively, adjacent to the processing chamber 240. The heaters 232, 234 serve to evenly maintain the temperature of the source gas and the purge gas supplied into the processing chamber 240. The heaters 232, 234 may include respective band heaters, for example.

A chuck 242 is installed in the processing chamber 240 for supporting the semiconductor substrate W. A fourth heater (not shown) is installed in the processing chamber 240 to heat the semiconductor substrate W to the processing temperature. A vacuum pump (not shown) is connected to one side portion of the processing chamber 240, and a pressure control valve (not shown) and a gate valve (not shown) are installed in a vacuum line connecting the vacuum pump and the processing chamber 240 so that the inner pressure of the processing chamber 240 can be controlled.

After the carrier gas is heated in the hot gas generator 212, the heated carrier gas is supplied through the carrier gas supplying line 214 and the flow rate control valve 216. Then, the heated carrier gas is bubbled in the liquid source 10 disposed in the container 218. The temperature of the heated carrier gas is preferably equal to or greater than that of the heated liquid source 10 because the evaporation efficiency of the liquid source 10 is increased in accordance with the increase in the temperature of the carrier gas.

The vapor source vaporized from the liquid source 10 is mixed with the heated carrier gas bubbled in the liquid source 10, thereby forming the source gas 20. The source gas 20 is supplied into the processing chamber 240 through the source gas supplying line 222 and the IGS unit 230. The IGS unit 230 controls the supply flow rate and supply time of the source gas.

Meanwhile, the purge gas is provided into the processing chamber 240 from the hot gas generator 212 through the purge gas supplying line 224 and the IGS unit 230. The IGS unit 230 controls the supply flow rate and supply time of the purge gas.

The second and the third heaters 232 and 234, installed in the second source gas supplying tube 222b and the second purge gas supplying tube 224b adjacent to the processing chamber 240, maintain the temperature of the source gas and the temperature of the purge gas, respectively. That is, the temperatures of the source gas and the purge gas can be controlled by the second heater 232 and the third heater 234 at a predetermined temperature.

The source gas and the purge gas are successively provided into the processing chamber 240. The source gas provided in the processing chamber 240 forms the film on the semiconductor substrate W. The purge gas provided in the processing chamber 240 purges the processing chamber 240. The source gas and the purge gas are repeatedly provided into the processing chamber 240 so that a film having a desired thickness is formed on the semiconductor substrate W. Reaction by-products and un-reacted gas are generated during the formation of the film on the semiconductor substrate W by means of the source gas, and are exhausted from the processing chamber 240 by the purge gas provided into the processing chamber 240 and operation of the vacuum pump connected to the processing chamber 240.

The temperatures of the IGS unit 230 and the gas supplying lines 222, 224 are constantly maintained during the formation of the film on the semiconductor substrate W. The source gas and the heated purge gas maintain the constant temperature of the IGS unit 230, and the second and the third heaters 232 and 234 constantly maintain the temperature of the second source gas tube 222b and the purge gas supplying tube 224b. An additional heater can be installed for constantly maintaining the temperature of the IGS unit 230. In this manner, impurities can be prevented from being extracted from the source gas. The lengths of the first source gas tube 222a and the first purge gas supplying tube 224a may be sufficiently short so that the temperatures of the source gas and the heated purge gas are not lowered. However, an additional heater may be installed where the temperatures of the source gas and the heated purge gas are affected by the lengths of the first source gas tube 222a and the first purge gas supplying tube 224a.

A controller 250 is connected to the hot gas generator 212 to control the heating temperature of the inert gas used as the carrier gas and the purge gas. The controller 250 controls the degree of opening of the flow control valve 216 so that the controller 250 adjusts the flow rate of the heated carrier gas provided from the hot gas generator 212 to the container 218. In addition, the controller 250 is connected to control the heating temperature of the liquid source 10, and is connected to the second and the third heaters 232 and 234 for constantly maintaining the temperature of the source gas and the purge gas provided into the processing chamber 240.

The IGS unit 230 is connected to the controller 250 to control the supply times and the supply flow rates of the source gas and the purge gas in accordance with a control signal generated from the controller 250.

Figure 6:
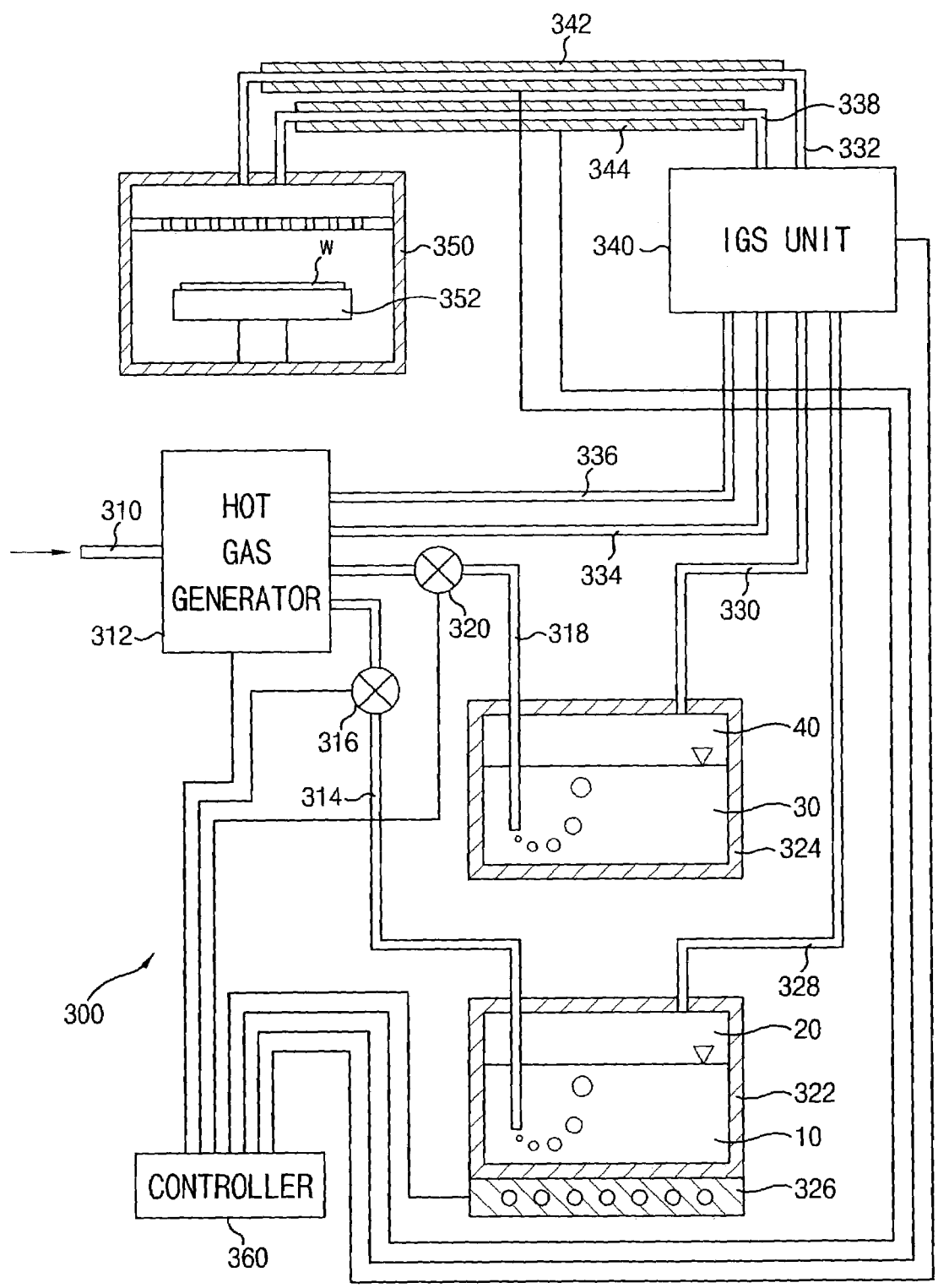
FIG. 6 is a schematic cross-sectional view illustrating an apparatus for supplying a plurality of source gases according to further embodiments of the present invention.

As shown in FIG. 5, the source gas supplying apparatus 200 supplies the processing chamber 240 with one source gas 20. Various source gases may be successively used during the formation of the film on the semiconductor substrate W. Thus, several source gas supplying apparatus may be required for supplying different source gases. FIG. 6 is a schematic cross-sectional view illustrating an apparatus for supplying a plurality of source gases according to further embodiments of the present invention.

The liquid sources for depositing the film on the semiconductor substrate W may have characteristics different from one another. For example, the titanium alkoxide (Ti[OC$_3$H$_7$]$_4$) forms a source gas at a temperature of approximately 80 to 100° C. while the trimethyl aluminum (Al[CH$_3$]$_3$) forms a source gas at room temperature. That is, the trimethyl aluminum can form a source gas having sufficient concentration at room temperature while titanium alkoxide does not form a source gas having sufficient concentration at room temperature. Hence, the liquid source and the carrier gas should be heated to increase the vapor pressure of the vapor source to a predetermined vapor pressure. The predetermined vapor pressure means the vapor pressure at which the source gas formed from the liquid source has sufficient concentration to obtain a film having the desired thickness. When a titanium oxide film is formed on a semiconductor substrate, the titanium alkoxide is heated to have a temperature corresponding to the predetermined vapor pressure, wherein the vapor pressure of the vapor source is previously established to obtain a source gas having the concentration for forming the titanium oxide film having the desired thickness.

Referring to FIG. 6, different liquid sources 10 and 30 are disposed in a first container 322 and a second container 324, respectively. While two containers 322, 324 are shown, the number of containers can be varied.

A first heater 326 is installed beneath the first container 322 for heating the first liquid source 10 in the first container 322. The first liquid source 10 received in the first container 322 is changed into a vapor source during heating the first liquid source 10 at a predetermined temperature while a second liquid source 30 disposed in the second container 324 is changed into a vapor source at room temperature. That is, the first liquid source 10 has the predetermined vapor pressure at the predetermined temperature, and the second liquid source 30 has the predetermined vapor pressure at room temperature.

A supply gas supplying line 310 is connected to a hot gas generator 312 for supplying a supply gas, which may be an inert gas such as a nitrogen gas or an argon gas, to the hot gas generator 312. The supply gas supplied through the supplying line 310 may be directed to a first carrier gas supplying line 314, a second carrier gas supplying line 318, a first purge gas supplying line 334, and a second purge gas supplying line 336.

The first carrier gas supplying line 314 connects the hot gas generator 312 and the first container 322. The second carrier gas supplying line 318 connects the hot gas generator 312 to the second container 324. The hot gas generator 312 selectively heats the first carrier gas provided into the first container 322. The heated first carrier gas is provided into the first container 322 through the first carrier gas supplying line 314. The second carrier gas at the room temperature is provided into the second container 324 through the second carrier gas supplying line 318.

A first flow rate control valve 316 is installed in the first carrier gas supplying line 314 to control the heated first carrier gas. A second flow rate control valve 320 is installed in the second carrier gas supplying line 318 to control the second carrier gas at room temperature.

A first vapor source is formed by the bubbling of the heated first carrier gas and the heating of the first heater 326, and is mixed with the heated first carrier gas bubbled in the heated first liquid source 10. A first source gas 20 including the first vapor source and the heated first carrier gas is provided into a processing chamber 350 through a first source gas supplying line 328, an IGS unit 349, and a third source gas supplying line 332. A second vapor source is formed by the bubbling of the second carrier gas with a temperature at room temperature and is mixed with the second carrier gas bubbled in the second liquid source 30. A second source gas 40 including the second vapor source and the second carrier gas is provided into the processing chamber 350 through a second source gas supplying line 330, the IGS unit 349, and the third source gas supplying line 332. The IGS unit 340 controls the supply times and the flow rates of the first and second source gases 20 and 40.

The hot gas generator 312 selectively heats a first purge gas. The first purge gas heated by the hot gas generator 312 is provided from the hot gas generator 312 into the processing chamber 350 through the first purge gas supplying line 334, the IGS unit 340, and a third purge gas supplying line 338 after the first source gas 20 is supplied. A second purge gas having a temperature at room temperature is provided from the hot gas generator 312 into the processing chamber 350 through the second purge gas supplying line 336, the IGS unit 340, and the third purge gas supplying line 338 after the second source gas 40 is supplied into the processing chamber 350. The IGS unit 340 controls the supply times and the flow rates of the heated first purge gas and the second purge gas having a temperature at room temperature.

A second heater 342 and a third heater 344 are installed around the third source gas supplying line 332 and the third purge gas supplying line 338, respectively. The second and the third heaters 342 and 344 constantly maintain the temperature of the source gas and the purge gas. A fourth source gas supplying line can be installed between the IGS unit 340 and the processing chamber 350 if the second source gas 40 is thermally unstable.

A controller 360 is connected to the hot gas generator 312 to control the heating temperatures of the first carrier gas and the first purge gas, and the controller 360 controls the degree of opening of the first and second flow rate control valves 316 and 320. Also, the controller 360 is connected to the first heater 326 for controlling the heating temperature of the first liquid source 10, and is connected to the second and the third heaters 342 and 344 to constantly maintain the temperature of the first source gas 20 and the first purge gas provided into the processing chamber 350. The IGS unit 340 is connected to the controller 360 to control the supply times and the flow rates of the source gas and purge gas.

Hereinafter, a method for forming a titanium oxide film on a semiconductor substrate using an atomic layer deposition process will be described in detail with reference to FIG. 5.

The carrier gas heated by the hot gas generator 212 is bubbled in the liquid source 10 disposed in the container 218 to form that the first source gas 20. The liquid source 10 received in the container 218 is heated to a temperature of approximately 80 to 100° C. The temperature of the heated carrier gas is equal to or greater than that of the heated liquid source 10. Argon gas may be used as the carrier gas, and the liquid source may be titanium alkoxide ($Ti(OC_3H_7)_4$).

The first source gas 20 formed in the container 218 is provided into the processing chamber 240 through the IGS unit 230. One portion of the titanium alkoxide is chemically absorbed on the semiconductor substrate W, and the other portions of the titanium alkoxide are loosely physically combined with the portion chemically absorbed with the surface of the semiconductor substrate W.

Then, the heated purge gas is provided from the hot gas generator 212 to the processing chamber 240 through the IGS unit 230. The purge gas includes the same gas (e.g., argon gas) as the carrier gas. The other portions of the titanium alkoxide not chemically absorbed on the semiconductor substrate W are removed from the processing chamber 240 by the supply of the purge gas and operation of the vacuum pump so that only the portion of the titanium alkoxide chemically absorbed remains on the semiconductor substrate W.

Subsequently, the second source gas is supplied into the processing chamber 240. The second source gas may include $O_3$, a plasma of $O_2$, a remote plasma of $O_2$, or a plasma of $N_2O$. The activated oxygen in the second source gas reacts with the titanium alkoxide chemically absorbed on the semiconductor substrate W such that the atomic layered titanium oxide film ($TiO_2$) is formed on the semiconductor substrate W.

Then, the purge gas is provided into the processing chamber 240 to exhaust the un-reacted second source gas from the processing chamber 240. A titanium oxide film having the desired thickness may be formed by repeatedly performing the above-described steps of supplying the first source gas, supplying the purge gas, supplying the second source gas, and supplying the purge gas.

According to the present invention, the evaporation efficiency of the liquid source can be improved because the heated carrier gas is bubbled in the liquid source, thereby augmenting the temperature of the source gas. That is, the concentration of the source gas can be increased as the vapor pressure of the vapor source increases, thereby improving the deposition efficiency of the film formed on the semiconductor substrate.

Also, extraction of impurities from the source gas due to an increase in the temperature of the source gas and the purge gas may be prevented or reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for supplying a source gas to a processing chamber for forming a film on a substrate in the processing chamber, the method comprising:
   a) heating a carrier gas;
   b) bubbling the heated carrier gas in a liquid source disposed in a container to form a vapor source;
   c) heating the liquid source; and
   d) supplying a source gas including the vapor source and the heated carrier gas into the processing chamber for forming the film;
   e) wheren a temperature of the heated carrier gas is at least as great as a temperature of the heated liquid source.

2. The method for supplying a source gas of claim 1, further comprising:
   heating a purge gas; and
   supplying the heated purge gas into the processing chamber to purge the processing chamber after forming the film.

3. The method for supplying a source gas of claim 2, wherein a temperature of the heated carrier gas is substantially the same as a temperature of the heated purge gas.

4. A method for supplying a source gas and a purge gas to a processing chamber for forming a film on a substrate in the processing chamber, the method comprising:
   a) heating a carrier gas;
   b) heating a purge gas;
   c) heating a liquid source disposed in a container;
   d) bubbling the heated carrier gas in the heated liquid source to form a vapor source;
   e) supplying a source gas including the vapor source and the heated carrier gas into the processing chamber; and
   f) supplying the heated purge gas into the processing chamber to purge the processing chamber.

5. The method for supplying a source gas of claim 4, wherein the heated carrier gas and the heated purge gas each have temperatures at least as great as a temperature of the heated liquid source.

6. An apparatus for supplying a source gas and a purge gas to a processing chamber for forming a film on a substrate in the processing chamber, the source gas including a carrier gas and a vapor source, the apparatus comprising:
   a) a hot gas generator to heat the carrier gas and to heat the purge gas;
   b) a container to hold a liquid source;
   c) a carrier gas supplying line configured to bubble the heated carrier gas in the liquid source to form the vapor source;
   d) a source gas supplying line to supply the source gas including the vapor source and the heated carrier gas into the processing chamber; and
   e) a purge gas supplying line to supply the heated purge gas into the processing chamber to purge the processing chamber.

7. The apparatus of claim 6, further comprising a heater to heat the container.

8. The apparatus of claim 6, further comprising an integrated gas supply unit to control flow rates and supply times of the source gas and the heated purge gas.

9. The apparatus of claim 8, wherein:
   a) the source gas supplying line includes:
      a first source gas supplying tube connecting the container and the integrated gas supply unit; and
      a second source gas supplying tube connecting the integrated gas supply unit and the processing chamber, and
   b) the purge gas supplying line includes:
      a first purge gas supplying tube connecting the hot gas generator and the integrated gas supply unit; and
      a second purge gas supplying tube connecting the integrated gas supply unit and the processing chamber.

10. The apparatus of claim 9, further comprising:
    a) a first heater connected to the second source gas supplying tube to maintain a temperature of the source gas provided into the processing chamber through the second source gas supplying tube; and
    b) a second heater connected to the second purge gas supplying tube to maintain a temperature of the heated purge gas provided into the processing chamber through the second purge gas supplying tube.

11. The apparatus of claim 6, further comprising a flow rate control valve installed in the carrier gas supplying line to control a flow rate of the heated carrier gas provided into the container through the carrier gas supplying line.

12. The apparatus of claim 6, further comprising a controller connected to the hot gas generator to control a temperature of the heated carrier gas and a temperature of the heated purge gas.

13. An apparatus for supplying a first source gas and a second source gas to a processing chamber for forming first and second films, respectively, on a substrate in the processing chamber, the first source gas including a first carrier gas and a first vapor source, the second source gas including a second carrier gas and a second vapor source, the first vapor source having a first vapor pressure at a prescribed temperature and the second vapor source having a second vapor pressure at room temperature, the apparatus comprising:
  a) a hot gas generator operative to selectively heat the first carrier gas relative to the second carrier gas;
  b) a first container to hold the first liquid source;
  c) a second container to hold the second liquid source;
  d) a first carrier gas supplying tube configured to bubble the first carrier gas selectively heated by the hot gas generator in the first liquid source to form the first vapor source;
  e) a second carrier gas supplying tube configured to bubble the second carrier gas in the second liquid source to form the second vapor source;
  f) a first source gas supplying tube to supply the first source gas including the first vapor source and the heated first carrier gas from the first container into the processing chamber; and
  g) a second source gas supplying tube to supply the second source gas including the second vapor source and the second carrier gas from the second container into the processing chamber.

14. The apparatus of claim 13, wherein the hot gas generator further selectively heats a first purge gas relative to a second purge gas, the first purge gas being adapted for purging the processing chamber after supply of the first source gas, the second purge gas being adapted for purging the processing chamber after supply of the second source gas.

15. The apparatus of claim 14, further comprising:
  a) a first purge gas supplying tube to supply the heated first purge gas from the hot gas generator into the processing chamber; and
  b) a second purge gas supplying tube to supply the second purge gas from the hot gas generator into the processing chamber.

16. The apparatus of claim 15, further comprising an integrated gas supply unit to control flow rates and supply times of the first source gas, the second source gas, the first purge gas, and the second purge gas.

17. The apparatus of claim 13, further comprising a heater to heat the first container.

18. The apparatus of claim 13, further comprising:
  a) a first flow rate control valve installed in the first carrier gas supplying tube to control a flow rate of the first carrier gas; and
  b) a second flow rate control valve installed in the second carrier gas supplying tube to control a flow rate of the second carrier gas.

19. A method for supplying a source gas to a processing chamber for forming a film on a substrate in the processing chamber, the method comprising:
  a) heating a carrier gas;
  b) bubbling the heated carrier gas in a liquid source disposed in a container to form a vapor source;
  c) supplying a source gas including the vapor source and the heated carrier gas into the processing chamber for forming the film;
  d) heating a purge gas; and
  e) supplying the heated purge gas into the processing chamber to purge the processing chamber after forming the film.

20. The method for supplying a source gas of claim 19, wherein a temperature of the heated carrier gas is substantially the same as a temperature of the heated purge gas.

* * * * *